United States Patent [19]

Minner

[11] 4,156,134
[45] May 22, 1979

[54] REMOTE CONTROL DEVICE FOR OPERATION BY RADIATION

[75] Inventor: Willy Minner, Schwaigern, Fed. Rep. of Germany

[73] Assignee: Licentia Patent-Verwaltungs G.m.b.H., Frankfurt am Main, Fed. Rep. of Germany

[21] Appl. No.: 732,438

[22] Filed: Oct. 14, 1976

[30] Foreign Application Priority Data

Oct. 14, 1975 [DE] Fed. Rep. of Germany ....... 2545945

[51] Int. Cl.² .............................................. H04B 9/00
[52] U.S. Cl. ............................................... 250/199
[58] Field of Search .................................... 250/199

[56] References Cited

U.S. PATENT DOCUMENTS 3,866,177 2/1975 Kawamata et al. .................. 250/199
3,928,760 12/1975 Isoda .................................... 250/199

Primary Examiner—Richard Murray
Attorney, Agent, or Firm—Spencer & Kaye

[57] ABSTRACT

A remote control device for operation by means of radiation comprising a receiver for the radiation including means for transforming the radiation into an electric signal and rectification means for rectifying the electric signal.

4 Claims, 12 Drawing Figures

POTENTIAL THRESHOLD ↓ISTEP

POTENTIAL THRESHOLD ↓ISTEP

REMOTE CONTROL DEVICE FOR OPERATION BY RADIATION

BACKGROUND OF THE INVENTION

Remote control of devices for example remote operation of programs, the volume, the brightness and the colour saturation of television sets, may take place as is known with the aid of infra-red radiation as a means of transmission. With remote control by means of infra-red radiation, pulses of different frequency are radiated by an infra-red emitter, these pulses being received by an infra-red receiver and being converted into electrical commands in dependence on the received frequency or the frequency combination. These electrical commands are used to change programs or to control analog functions.

These transmission paths can obviously be destroyed considerably by disturbing surrounding light, for example, incandescent lamp light, because the infra-red receiver registers the disturbing incandescent light and as a result superimposes a coarse noise of considerable amplitude on the signal received. In order that the instruction emitter present at the receiving end does not respond to the coarse noise, a Schmitt trigger, for example, is connected at the output side of the infra-red receiver, said Schmitt trigger only responding from a certain settable potential threshold onwards and only passing on the pulses freed from the noise to the instruction emitter. In order to achieve this the potential threshold of the trigger must be so set that a signal which has been received and which does not contain any coarse noise makes the trigger respond while a coarse noise caused by disturbing incandescent light still lies below the response threshold.

SUMMARY OF THE INVENTION

It is an object of the invention to provide remote control by means of radiation in which the separation of interference is improved relative to known arrangements.

According to a first aspect of the invention, there is provided a remote control device for operation by means of radiation comprising a receiver for said radiation, means in said receiver for transforming received radiation into an electrical signal and rectifier means in said receiver for rectifying said electrical signal.

According to a second aspect of the invention, there is provided a remote control device operated by means of radiation, particularly infra-red radiation, characterized in that rectification means is present at the receiver, said rectification means rectifying the radiation transformed into an electrical signal.

BRIEF DESCRIPTION OF THE DRAWINGS

The invention will now be described in greater detail, by way of example, with reference to the drawings, in which.

DESCRIPTION OF THE PREFERRED EMBODIMENT

Figure 1:
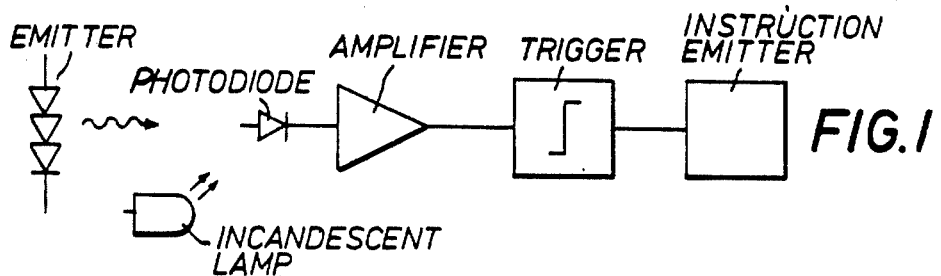
FIG. 1 shows diagrammatically a known form of remote control arrangement.
Figure 2A:
FIG. 2a shows the form of the remote control signal sent.
Figure 2B:
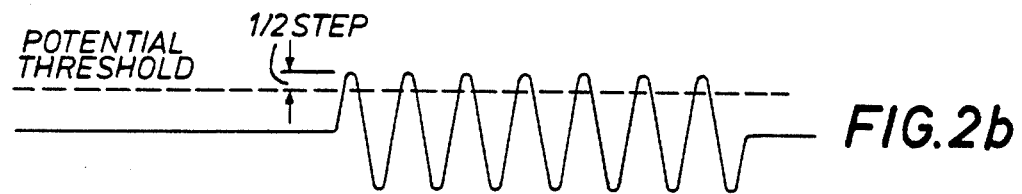
FIG. 2b shows the signal received by the receiver in the absence of interference.
Figure 2C:
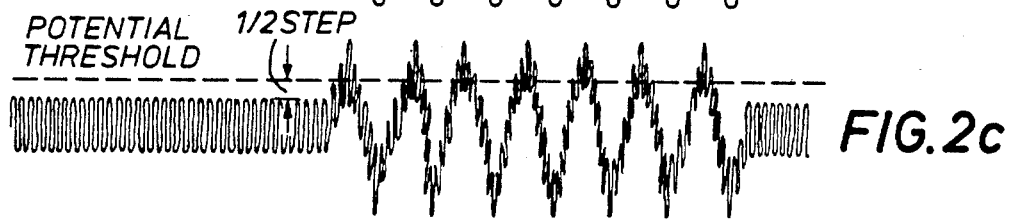
FIG. 2c shows the signal received by the receiver with interference present.
Figure 2D:
FIG. 2d shows the signal from the trigger output and supplied to the control.

FIG. 1 shows a known remote control arrangement. In this case, the remote control takes place by means of pulses of different frequency radiated by an infra-red emitter, these pulses being received by an infra-red receiver and being converted into electrical signals in dependence on the received frequency or frequency combination.

These transmission paths can be considerably disrupted by ambient light such as from an incandescent lamp. Thus, for example, a Schmitt trigger is connected into the transmission chain at the output of the infra-red receiver, the Schmitt trigger only responding above a settable potential threshold and only passing in pulses freed from noise to the instruction emitter.

In order to achieve this, as is shown in FIG. 2, the potential threshold of the trigger must be so set that a signal which has been received and which does not contain any coarse noise makes the trigger respond while a coarse noise caused by a disturbing incandescent light still lies below the response threshold.

In the example of FIG. 2 the response threshold lies ½ step above the coarse noise and ½ step below the amplitude of the non-noisy signal. FIG. 2a shows the signal sent and FIG. 2b shows the signal received in a case where it is not restricted by disturbing incandescent light or by the coarse noise associated therewith. FIG. 2c shows a noisy signal as it arrives at the receiving end, when distrubing surrounding light, for example in the form of a burning incandescent lamp, is present. In order that the coarse noise, which is present even without a signal, does not make the trigger respond, the potential threshold of the trigger according to FIG. 2c must be placed above the amplitude of the coarse noise. Thus in accordance with FIG. 2c the potential threshold of the trigger lies ½ step above the coarse noise and ½ step below the amplitude of the non-noisy signal. While FIGS. 2b and 2c show the received signals which are supplied to the trigger in the non-noisy or in the noisy state, FIG. 2d shows the signal as it comes out of the trigger and is supplied to the instruction emitter.

In order to provide increased separation of the interference in this type of remote control, the invention proposes that rectification should be present at the receiving end rectifying the radiation which has been transformed into an electrical signal.

Figure 3:
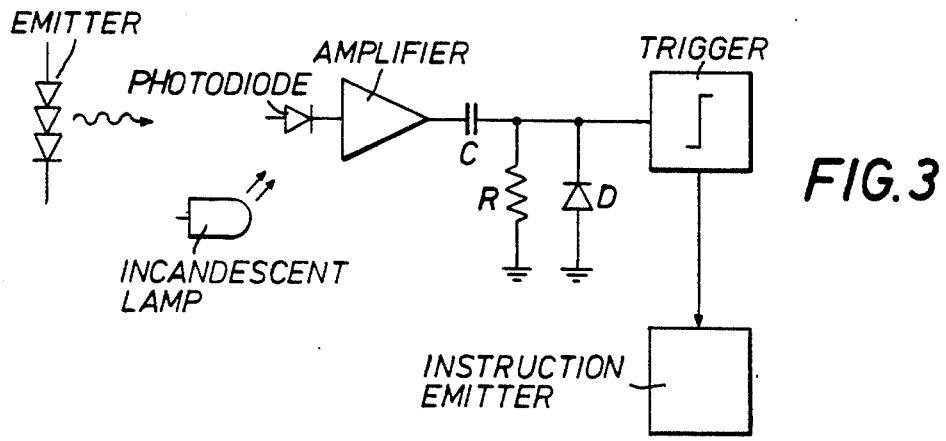
FIG. 3 shows diagrammatically one embodiment of a remote control arrangement in accordance with the invention.
Figure 4A:
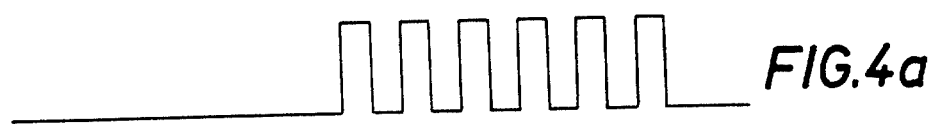
FIG. 4a shows the form of the remote control signal sent in the arrangement of FIG. 3.
Figure 4B:
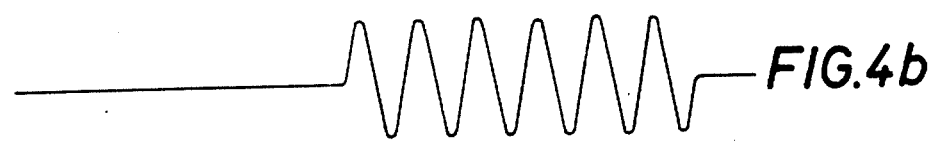
FIG. 4b shows the received signal without noise.
Figure 4C:
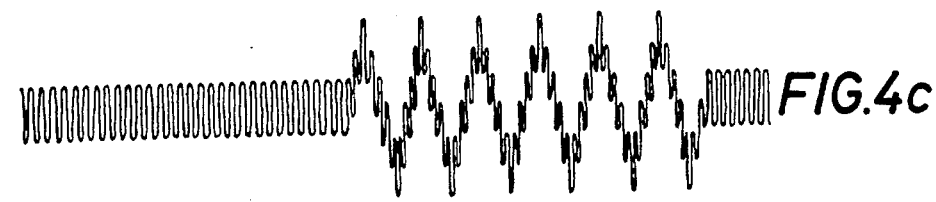
FIG. 4c shows the received signal with noise.
Figure 4D:
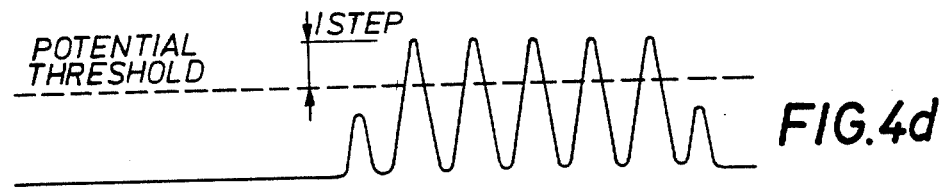
FIG. 4d shows the received signal without noise after rectification.
Figure 4E:
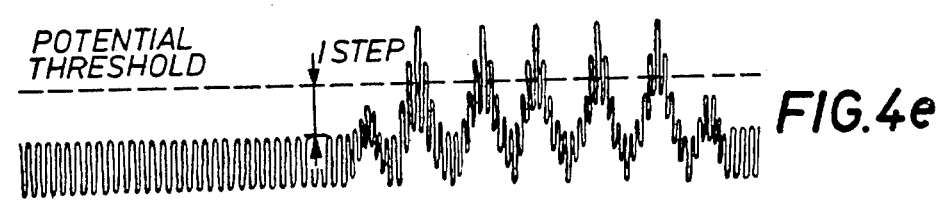
FIG. 4e shows the received signal with noise after rectification.
Figure 4F:
FIG. 4f shows the signal from the trigger of FIG. 3.

The signal level is bound to a reference potential by the invention. If rectification is connected between the amplifier and the trigger in the remote control of FIG. 1 as shown in FIG. 3 then, based on the invention, the potential threshold of the trigger may be set at 1 step above the coarse noise and 1 step below the maximum amplitude of the non-noisy signal. Thus the separation of the interference of a noisy signal is improved by the invention by a factor of 2 as compared to the arrangement without rectification.

While FIG. 2 shows the relationships with a remote control without rectification, FIG. 4 shows the relationships with a remote control in which rectification is present. FIG. 4a shows the signal sent, FIG. 4b shows the received signal without the coarse noise and FIG. 4c shows the received signal with the coarse noise in front of the rectifying arrangement. FIG. 4d shows the received signal without coarse noise after rectification and FIG. 4e shows the received signal with coarse noise also after rectification. As FIG. 4e shows, as a result of rectification, the potential threshold of the trigger may be set so that it lies not only ½ step, but 1 step above the coarse noise and 1 step below the amplitude of the non-noisy signal. Finally, FIG. 4f shows the signal after the trigger.

In accordance with FIG. 3 rectification device comprises for example an RC element in which a diode D is parallel-connected to the resistor R. With a useful frequency f the resistor R and the capacitance C and thus the time constant of the rectification are selected according to the relationship $RC \approx (5 \ldots 50)/f$. The resistor R and the diode D are connected to earth in the remote control arrangement of FIG. 2.

It will be understood that the above description of the present invention is susceptible to various modification changes and adaptations.

What is claimed is:

1. In a remote control device operated by means of a signal of a desired frequency transmitted via radiation, particularly infrared radiation, including a receiver for the radiation comprising means for transforming the received radiation into an electrical signal and an amplifier for said electrical signal; the improvement comprising: an RC member connected to said amplifier with the capacitor of said RC member having one end connected to the output of said amplifier and its other end connected to one end of the parallel connection of the resistor of said RC member and a diode, and with the other end of said parallel connection of said resistor and said diode being connected to a reference potential so that the amplified received signal present at said one end of said parallel connection is bound to a reference potential, and wherein the frequency f of the signal, the resistance R of said resistor, and the capacitance C of said capacitor are selected so that the relationship $fRC = 5$ to $50$ results.

2. A device as defined in claim 1, further comprising a trigger circuit having its input connected to said one end of said parallel connection.

3. A device as defined in claim 1, wherein said other end of said parallel connection of said resistor and said diode is connected to earth.

4. A device as defined in claim 1 further comprising means responsive to the signal present at the output of said parallel connection for initiating the control function, said means including a Schmitt trigger having its input connected to said one end of said parallel connection of said resistor and said diode.

* * * * *